(12) United States Patent
Young et al.

(10) Patent No.: US 7,990,054 B2
(45) Date of Patent: Aug. 2, 2011

(54) ORGANIC LED DEVICE WITH ELECTRODES HAVING REDUCED RESISTANCE

(75) Inventors: Edward Willem Albert Young, Maastricht (NL); Herbert Friedrich Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 407 days.

(21) Appl. No.: 12/097,348

(22) PCT Filed: Dec. 8, 2006

(86) PCT No.: PCT/IB2006/054696
§ 371 (c)(1),
(2), (4) Date: Jun. 13, 2008

(87) PCT Pub. No.: WO2007/072275
PCT Pub. Date: Jun. 28, 2007

(65) Prior Publication Data
US 2008/0265759 A1   Oct. 30, 2008

(30) Foreign Application Priority Data
Dec. 19, 2005  (EP) .................................. 05112417

(51) Int. Cl.
*H01J 1/62* (2006.01)
*H01J 9/24* (2006.01)
(52) U.S. Cl. ........................... 313/505; 313/506; 445/24

(58) Field of Classification Search .......... 313/503–506; 445/24
See application file for complete search history.

(56) References Cited

U.S. PATENT DOCUMENTS

| | | | |
|---|---|---|---|
| 6,500,295 B1 * | 12/2002 | Kubota | 313/506 |
| 6,621,213 B2 * | 9/2003 | Kawashima | 313/506 |
| 6,680,578 B2 | 1/2004 | Antoniadis et al. | |
| 6,835,470 B1 | 12/2004 | Magain et al. | |
| 7,157,156 B2 * | 1/2007 | Raychaudhuri et al. | 428/690 |
| 7,550,918 B2 * | 6/2009 | Tokuda et al. | 313/505 |
| 2002/0176992 A1 | 11/2002 | Parthasarathy et al. | |
| 2002/0196401 A1 | 12/2002 | Grace et al. | |
| 2003/0234608 A1 | 12/2003 | Lee et al. | |
| 2004/0124763 A1 | 7/2004 | Nathan et al. | |
| 2004/0124767 A1 | 7/2004 | Leung et al. | |
| 2005/0253507 A1 | 11/2005 | Fujimura et al. | |
| 2008/0252205 A1 * | 10/2008 | Young et al. | 313/504 |

FOREIGN PATENT DOCUMENTS

| | | |
|---|---|---|
| EP | 1369938 A2 | 12/2003 |
| WO | WO2006087653 A2 | 8/2006 |

* cited by examiner

*Primary Examiner* — Peter Macchiarolo

(57) ABSTRACT

Organic electroluminescent device with a layer stack for emitting light through a top electrode includes a conductive foil having a carrier material with an upper and a lower side as a substrate and a first metal layer with a thickness resulting in a sheet resistance of less than 0.05 Ω/square on the upper side of the carrier material. The first metal layer act as a bottom electrode, and an organic layer stack is formed on top of the bottom-electrode for emitting light through the top electrode, which is formed on top of the organic layer stack. A partly transparent protection element covers at least the top electrode and the organic layer stack.

14 Claims, 3 Drawing Sheets

ORGANIC LED DEVICE WITH ELECTRODES HAVING REDUCED RESISTANCE

Figure 1:
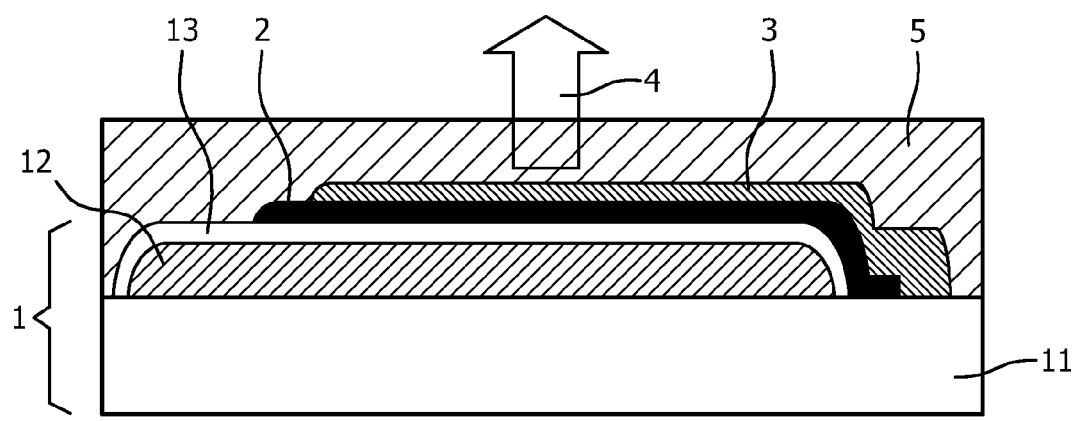

This invention relates to large organic electroluminescent devices (organic LED or OLED) with flexible substrates and a uniform luminance over the emitting area.

Standard OLEDs nowadays comprise an organic layer stack arranged between two electrodes deposited on a glass substrate. Two different types of OLEDs can be distinguished with respect to the direction of light emission. In so-called bottom emitters, the light leaves the OLED device through a transparent bottom electrode (usually the anode) and a transparent substrate while a second electrode (top electrode, usually the cathode) is reflective. In so-called top emitters the light leaves the OLED device through a transparent top electrode while the bottom electrode and/or the substrate is reflective. In most cases, the layer structure of bottom emitters is simply inverted for top-emitters.

Both bottom and top emitting OLED devices use common thin-film electrodes that exhibit a high sheet resistance of equal to or more than 0.1 $\Omega$/square, where the term "square" denotes the electrode area. The resistance of anode and cathode imposes limits on the maximum size of a light-emitting area if a homogeneous luminance is to be obtained over the entire emitting area. For current material systems, this area is of the order of a few tens of square cm. For OLEDs in a top emission configuration, the size limitation may be even more severe, in particular if ITO is used on top. The optimization of the electrical parameters of the ITO is compromised by optical requirements and process temperature restrictions. To increase the light-emitting area of an OLED device further, it has to be subdivided into sub-tiles in order to reduce the individual electrode size. Each sub-tile can be considered as a light-emitting sub-OLED. Sub-tile-OLEDs are interconnected on the substrates by metal tracks. The total light-emitting area for an OLED consisting of sub-tiles is the sum of the light-emitting areas of each sub-tile. For large-area applications, the resistance of the metal tracks should be well below 0.01 $\Omega$/square. Moreover, thin-film technology is not sufficient for large-area solutions because the resistance of thin layers is too high and the production of sufficiently thick layers having the required resistance is expensive and time consuming.

The European patent application with application number EP05101161.7 discloses a bottom emitting OLED device with a metal foil glued on top of the reflective top cathode for protecting the organic layers so as to ensure a long operational life of the device and to improve the electrical conductivity of one of the electrodes. This technique is not applicable to top emitters, because a thick cover foil on top of a top-electrode will prevent light emission in top-direction.

It is an object of the present invention to provide a large organic electroluminescent top emitting device with a homogeneous luminance over the entire emitting area, which device has a good lifetime behavior and can be produced with low effort.

This object is solved by an organic electroluminescent device with a layer stack for emitting light through an at least partly transparent top electrode comprising a conductive foil comprising a carrier material with an upper and a lower side as a substrate and a first metal layer with a thickness such as to result in a sheet resistance of less than 0.05 $\Omega$/square on the upper side of the carrier material, the latter comprising at least a first metal area as a bottom electrode, an organic layer stack deposited on top of the bottom electrode designed to emitting light, the transparent top electrode on top of the organic layer stack, and an at least partly transparent protection element covering at least the top electrode and the organic layer stack. The term "layer stack" denotes a sequence of different layers. Consequently the term "organic layer stack" denotes a sequence of different organic layers. This conductive foil provides a sufficiently low-ohmic electrical interconnect via the first metal layer and at the same time acts as an electrode in the organic LED in order to reduce a voltage drop strongly at least along the bottom electrode. A homogeneous luminance can be achieved also for large-area organic LEDs, for example with an emitting area of the order of several tens of times 10 cm*10 cm and more, thanks to this strongly reduced voltage drop. The low sheet resistance may be achieved, for example, with sufficiently thick metal layers and/or highly conductive materials such as gold, silver, or copper. Conductive foils may be produced separately from the remaining layer stack of the OLED device by simple and cheap bonding techniques, for example glueing of a metal layer on top of a carrier material, in contrast to expensive thin-film deposition techniques used in prior art OLEDs. The carrier material may be any material suitable for carrying metal layers of thicknesses of some tens of micrometers or more, for example glass or polyimide films. The protection element denotes any measure to protect the organic layer against the environment to obtain sufficient device lifetimes. Protection elements may be chemically inert layers or rigid coverlids around the environmentally sensitive part of the OLED device.

In one embodiment, the first metal layer further comprises a conductive diffusion barrier layer at the interface to the organic layer stack. Diffusion of electrode material into the organic material leads to an increased level of impurities disturbing the properties of the organic material. Such a diffusion barrier will decrease or prevent a degradation of the emission properties of the organic layer stack and therefore will increase the operational life of such an OLED device.

In one embodiment, the transparent top electrode is made of indium-tin oxide (ITO). ITO is an electrically conductive and transparent material. Besides having the required electrical properties, the top electrode simultaneously acts as a barrier layer in order to protect the organic layer stack against the environment. However, even transparent ITO layers absorb a certain amount of light, which imposes limits on the ITO layer thickness. In an alternative embodiment, the transparent top electrode has a thickness below 20 nm and comprises a top metal layer and an electron injection layer at the interface with the organic layer stack. Even such thin metal layers have a lower sheet resistance than ITO layers. Also, the preparation of metal layers is easier than that of, for example, ITO layers. On the other hand, the required transparency limits the top electrode thickness to values below 20 nm, which inevitably results in an additional effort to protect the organic layer stack against the environment.

In another embodiment, the first metal layer further comprises a second metal area that is electrically insulated from the first metal area and is designed to provide a direct electrical contact to the transparent top electrode. Here, direct electrical contact denotes a contact without any intermediate organic layers between the second metal area and the top electrode. This can be achieved with common masking techniques during the deposition of the organic layer stack and top electrode. The connection of the top electrode to a low-ohmic conducting material distributes the driving current of the OLED devices close to the light-emitting area (the organic layer stack) almost without ohmic losses, whereby the length of the conducting path through a material of higher resistance (top electrode) is reduced. So, the second metal area acts as a shunt and provides an overall lower resistance for the top electrode current supply. This results in a further improved homogeneity of the luminance of the OLED device.

The homogeneity can be even further improved if the layers of the layer stack are patterned into sub-areas in order to form light-emitting sub-tiles which are separated from each other by non-emitting areas so as to provide conducting metal tracks to each sub-tile. Here, the patterned sub-areas may be regularly or irregularly shaped. A light-emitting sub-tile denotes a local part (sub-area) of the OLED device comprising a local layer stack capable of emitting light. The total light-emitting area of the OLED is the sum of the sub-tile areas. The non-emitting areas are areas where either no light-emitting organic material is present or no driving voltage can be applied to the organic layer. For example, the non-emitting area may comprise a conductive material in order to distribute the current over a wide portion of the OLED device almost without ohmic losses. So the non-emitting areas are essentially well-conducting metal tracks with a sheet resistance below 0.05 Ω/square and act as shunts to bottom and/or top electrodes in order to provide an overall lower resistance, resulting in a homogeneous luminance over the total light-emitting area.

In another embodiment, the first and the second metal area of the first metal layer are separated by an insulating filling material. The insulating filling material is used for planarization of the layer stack. Such a planarization avoids layer faults within the following layers to be prepared on the existing layer stack because of edges/curves in some of the subjacent layers. The filling material is located between the first and second metal areas, and therefore the filling material has to be an insulating one, such as a standard resin. The insulating filling material between electrical conducting materials additionally minimizes the risk of flashovers or critical leakage currents flowing directly from one electrode to the other. The term "separated" here means that no conductive path is present between the first and second metal areas before the organic layer stack and the top electrode are deposited.

In another embodiment, the conducting foil further comprises a second metal layer with a thickness that results in a sheet resistance of less than 0.05 Ω/square on the lower side of the carrier material, and at least one conducting path through the carrier material to connect the second metal layer either to the first or to the second metal area of the first metal layer on the upper side of the carrier material. The electrical connection of the top electrode to a power supply via the second metal layer can be achieved more easily, especially in the case of patterned sub-areas, by additionally using the backside of the carrier material for the current supply (second metal layer) and contacting the first or second metal area of the first metal layer directly through the carrier material. More metal layers may also be added in other embodiments. These embodiments with three or more metal layers may be used to address areas with, for example, different colors or address areas in a multiplexing mode as commonly used in passive (matrix) liquid crystal (segmented) displays.

In another embodiment, the conductive foil is a flexible conductive foil comprising a flexible carrier material. Such a conductive foil provides an OLED device combining a homogeneous luminance with the advantage of a flexible light source and renders possible an application of the present invention additionally in fields where non-flat, for example curved or flexible light sources are required or desired.

In another embodiment, the protection element comprises a transparent, chemically inert layer covering at least the transparent top electrode and the organic layer stack. A transparent, chemically inert layer will maintain the flexibility of the flexible conductive foil while simultaneously providing an OLED device with a long useful life.

In another embodiment, at least the first metal layer comprises copper. Copper is a very well-conducting material. Additional coatings may be applied on the copper, such as a gold and silver coating. These coatings may also provide a smooth surface whereon to deposit the remaining layer stack above the copper layer. A smooth surface will prevent layer faults caused by surface roughness leading to leakage currents from bottom to top electrode through the organic layer stack. Such coatings may be applied, for example, by electroplating on the copper.

In the present description and claims, the word "comprising" does not exclude other elements or steps, and the indefinite article "a" or "an" does not exclude a plurality. Any reference signs in the claims shall not be construed as limiting the scope of these claims.

Figure 2:
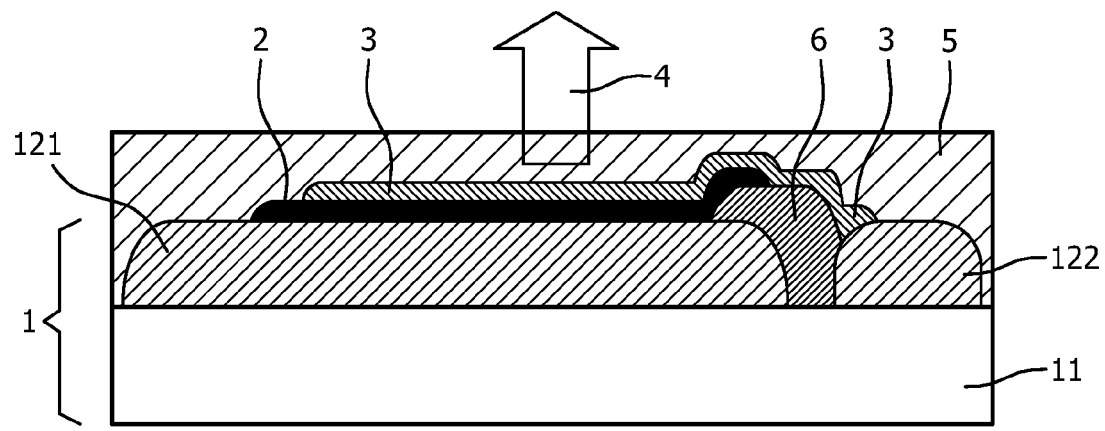
Figure 3:
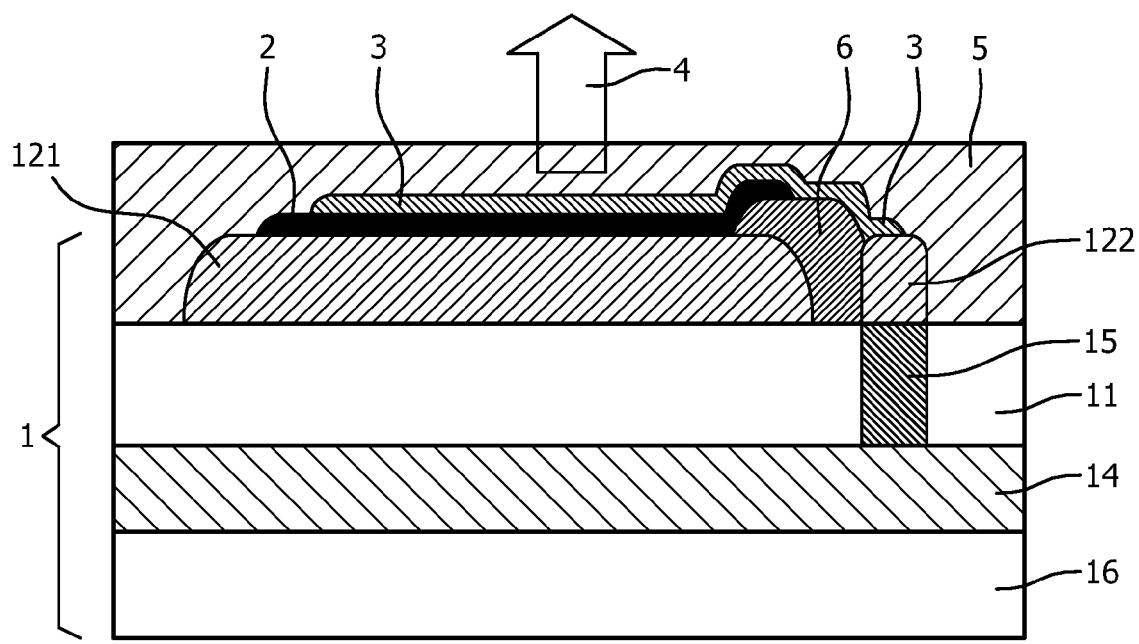
Figure 4:
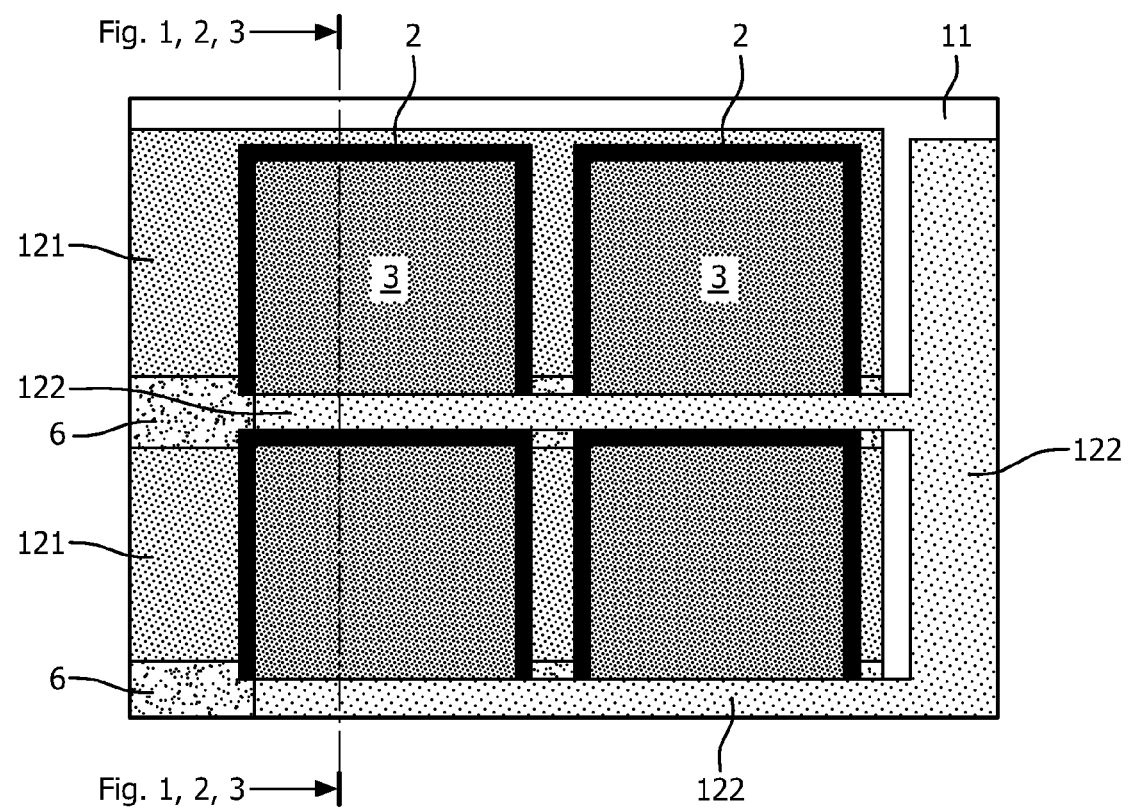

The following exemplary embodiments show examples of the proposed organic LED with reference to the accompanying Figures, without limiting the scope of the invention. In the Figures:

FIG. 1: is a side elevation of a first embodiment of an OLED device according to the present invention, FIG. 2: is a side elevation of an OLED device according to the present invention with a structured first metal layer, FIG. 3: is a side elevation of an OLED device according to the present invention with a second metal layer, FIG. 4: is a plan view of an OLED device with sub-tiles according to the present invention.

FIG. 1 shows an example of a top emitting organic OLED device according to the present invention with a layer stack 1, 2, 3 and 5 for emitting light 4 through an at least partly transparent top electrode 3 and an at least partly transparent protection element 5. The bottom electrode 12, the top electrode 3, and the organic layer stack 2 are covered by a protection element 5 in order to protect the organic layer stack 2 against the environment and thus to obtain a sufficient lifetime.

The organic layer stack 2 consists of one or more organic layers comprising at least one layer emitting light 4 to the top side of the OLED device. Beside the light-emitting layer, the organic layer stack 2 may comprise an electron transportation layer between the light-emitting layer and the cathode, and/or a hole transportation layer between the light-emitting layer and the anode. The organic layer stack 2 may also comprise more than one light-emitting layer, each emitting light of a different emission spectrum. The organic layers are usually provided by vapor deposition, e.g. evaporation, in the case of small organic molecules or by spin coating in the case of larger molecules. Typical thicknesses of an organic layer stack are between 50 nm and 500 nm. One example of an organic layer stack 2 is $AlQ_3$ (hole transportation layer)/α-NPD (light-emitting layer)/m-MTDATA doped with F4-TCNQ (electron transportation layer). Those skilled in the art are able to apply also other organic materials disclosed in the prior art.

The organic OLED device according to this invention as shown in FIG. 1 comprises a conducting foil 1 with a carrier material 11 having an upper and a lower side as a substrate and a first metal layer 12 with a thickness resulting in a sheet resistance less than 0.05 Ω/square on the upper side of the flexible carrier material 11, the latter comprising at least a first metal area as a bottom electrode. In the example shown in FIG. 1, the first metal layer is identical with the first metal area. The carrier material 11 may be rigid or flexible, depending on the application of the present OLED device, for example glass or plastic. If the carrier material 11 is flexible, the OLED device will exhibit an additional feature of a flexible light source. An OLED device with a bottom electrode area and a light-emitting area of 1 m² requires a driving current of 20 A to generate 1000 Cd/m² at 50 Cd/A. Given a sheet resistance of 0.05 Ω/square, a maximum voltage drop of 0.5 V is obtained across the bottom electrode. Voltage drops of up to 0.7 V are acceptable.

For example, single-sided flexible conducting foils are commercially available, for example from Nippon Mektron Ltd, comprising a 25 μm thick polyimide film and a 35 μm copper layer adhesively bonded to the polyimide film. Double-sided foils with copper foils on both sides of the polyimide film are also available. First metal layers of 35 μm thickness have sheet resistance values far below 0.01 Ω/square, in the case of copper of about 0.001 Ω/square. In other embodiments, other metals with good adhesion properties on flexible substrates, for example silver or gold, and also copper with a gold or silver coating, also have very low sheet resistance values and are suitable for low-resistance bottom electrode materials. The polyimide film acts as the flexible carrier material 11. As regards rigid carrier materials, very similar resistance values are obtained for metal layers of similar thicknesses.

The first metal layer 12 may further comprise a conducting diffusion barrier layer 13 at the interface with the organic layer stack 2. Diffusion of electrode material into the organic material leads to an increased level of impurities disturbing the properties of the organic material. For example, copper exhibits a relatively high diffusion rate. Suitable conducting diffusion barrier layers with thicknesses of a few nanometers consist of noble metals such as gold.

The transparent top electrode 3 on top of the organic layer stack 2 may comprise a transparent conducting material such as ITO or a metal. In the latter case, the metal layer thickness is limited to a thickness at which a metal layer is still at least partly transparent in the visible range of the spectrum. ITO layers are commonly deposited by sputtering, an additional protection layer between the ITO electrode 3 and the organic layer stack 2 being required to avoid deposition damage to the organic layers. An example of a suitable material for such a protection layer is a thin film of copper phthalocyanine (CuPc). The thickness of the ITO layer may be much greater than the thickness of a metal electrode. However, if ITO is used as a top electrode 3, the optimization of the electrical parameters of the ITO is compromised by optical requirements and deposition process temperature restrictions. Typical thicknesses of ITO electrodes are around 100 nm. One example of metal top electrodes 3 is an aluminum layer with a thickness below 20 nm with a layer, for example LiF, at the interface with the organic layer stack 2 in order to lower the work function of the top electrode 3. To achieve a good transparency of the top electrode 3, the thickness should be even lower, for example below 10 nm. Another suitable material for the top electrode 3 is silver in combination with highly doped electron injection/transport layers.

In FIG. 1, the protection element 5 covers not only the bottom electrode 12, but also the top-electrode 3 and the organic layer stack 2. The minimum requirement for the extension of the protection element 5 is to cover the organic layer stack 2 and the top-electrode 3 in order to prevent diffusion of critical gases, for example oxygen or water, from the environment into the organic layer stack 2. Suitable transparent materials for acting as a diffusion barrier are known to those skilled in the art, for example silicon nitride. A rigid, at least partly transparent cover lid may be glued on top of the upper side of the carrier material 11 as an alternative to a protection layer as a protection element 5 for providing a closed and sealed volume above the organic layer stack, which may be evacuated or filled with chemically inert gases or liquids.

Another embodiment of the present invention is shown in FIG. 2. Here, the diffusion barrier layer 13 of FIG. 1 is not shown, but may be present. The metal layer 12 comprises a first 121 and a second metal area 122, both with a sheet resistance according to this invention of less than 0.05 Ω/square on the upper side of the flexible carrier material 11. The upper side of the flexible carrier material 11 is the side where the organic layer stack 2 is deposited, the other side (lower side) can be considered as the backside of the OLED device. The separation of first 121 and second metal area 122 can be achieved, for example, by photolithography and etching. The term "separated" here means that no conductive path is present between the first 121 and the second metal area 122 before the deposition of the organic layer stack 2 and the top electrode 3.

The second metal area 122 has to be directly connected to the top electrode 3 as shown in FIG. 2 if it is to act as a shunt providing an overall lower resistance to the top electrode metal track. To obtain a good electrical contact between the two layers 3 and 122, any organic material has to be avoided on top of the second metal area 122. This can be achieved by proper masking techniques during the thin-film deposition. The organic layer stack is deposited on the first metal area 121 by suitable thin-film deposition techniques, for example evaporation and/or spin coating. An appropriate metal finishing may be applied to the first and second metal areas in order to modify roughness, reflectivity, and work function before the organic layer stack is deposited.

As shown in FIG. 2, the first 121 and second metal area 122 can be electrically separated by a insulating filling material 6 in order to avoid layer faults within the layers to be subsequently provided on the existing layer stack caused by edges/curves in some of the subjacent layers and to avoid leakage currents flowing directly from the first 121 to the second metal area 122 or vice versa. Without additional protection measures such leakage currents may be triggered, for example, by remaining metal materials after the laser structuring process of the conductive foil for obtaining separated first and second metal areas. A suitable material for suppressing leakage currents is any standard resin. The insulating filling material 6 is located below the organic layer stack 2, seen in light emission direction 4, therefore this insulating filling material 6 may be transparent or non-transparent. The presence of an insulating filling material 6 will improve the device's reliability.

Another embodiment is shown in FIG. 3. In contrast to the previous figures, the conductive foil 1 additionally comprises a second metal layer 14 at the lower side of the carrier material 11 with a sheet resistance according to this invention of less than 0.05 Ω/square, which second metal layer 14 is connected to the second metal area 122 at the upper side of the carrier material 11 via at least one conducting path 15 through the carrier material 11. So, the current supply to the top electrode 3 is achieved via the backside of the OLED device. This makes it easier on the one hand to contact the top electrodes 3 in the case of an OLED of a complicated structure with a multitude of sub-tiles, and on the other hand it reduces the surface area required for non-emitting areas on the upper side of the carrier material 11. There may be a non-conducting layer 16 on top of the second metal layer 14 for the purpose of electrical insulation. Very similar embodiments are also conceivable without the present insulating filling material 6 and/or with a diffusion barrier layer not shown in FIG. 3. The third metal layer 14 provides an additional protection against moisture penetration from the lower side of the carrier material into the OLED device.

In other embodiments, the second metal layer 14 may alternatively be contacted to the first metal area 121. In this case, the second metal area 122 will be electrically insulated from the second metal layer 14 and be contacted via the upper side of the carrier material 11 to the power supply not shown here.

FIG. 4 is a plan view of a sub-tile OLED device comprising first 121 and second metal areas 122 deposited on the upper side of the carrier material 11, separated by insulating filling materials 6 and with organic layer stacks 2 on top. The layers 121, 122, 2 and 3 are patterned into sub-areas in order to form light-emitting sub-tiles (four sub-tiles are shown here by way of example) separated from each other by non-emitting areas (areas where no organic layer stack 2 is present) to provide conducting metal tracks 121 and 122 to each sub-tile. A light-emitting sub-tile covers a local portion (sub-area) of the OLED device comprising the OLED layer stack for emitting light. The total light-emitting area of the OLED is the sum of the sub-tile areas, here shown as black areas 2. In FIG. 4, the top electrode 3 has been given a slightly smaller size to clarify the layer structure. In a sub-tile OLED device, the top electrode may also have the same size as the organic layer stack. Besides, a sub-tile may consist of a number of OLED devices in series. Also, the number and the shape of sub-tiles may be different from the example shown in FIG. 4. The top electrodes 3 cover the light-emitting organic layer stack 2 (black areas) and are electrically connected to the second metal layer 13.

Two OLED devices were successfully constructed on flexible copper foils. In both examples the copper layer (first metal layer) has a thickness of 35 µm and a resistance below 0.001 Ω/square. The substrate size was 49×49 mm², comprising 16 sub-tiles of 20 mm² size.

EXAMPLE 1

The organic electroluminescent device comprises the following layer stack on top of the carrier material 11. In this example, gold was used as a diffusion barrier layer 13:
Cu (35 µm)/Au (1 µm)/PEDOT (100 nm)/α-NPD (15 nm)/α-NPD:rubrene (15 nm)/AlQ$_3$ (60 nm)/LiF (1 nm)/Al (10 nm)

EXAMPLE 2

The organic electroluminescent device comprises the following layer stack on top of the carrier material 11. In this example, silver was used as a diffusion barrier layer 13:
Cu (35 µm)/Ag (1 µm)/PEDOT (100 nm)/α-NPD (15 nm)/α-NPD:rubrene (15 nm)/AlQ$_3$ (60 nm)/LiF (1 nm)/Al (10 nm)

PEDOT was used to overcome the work function mismatch of silver or gold with the hole transport layer α-NPD. Rubrene is a doping material and the actual fluorescent material in this stack. A homogeneous luminance was observed over the entire light-emitting area of all sub-tiles for both examples without any difference.

The embodiments explained with reference to the Figures and the description merely represent examples of an organic LED device and are not to be understood as restricting the patent claims relating to these examples. Alternative embodiments, which are likewise covered by the protective scope of the patent claims, are also possible to those skilled in the art. The numbering of the dependent claims does not imply that other combinations of the claims may not also represent advantageous embodiments of the invention.

The invention claimed is:

1. An organic electroluminescent device with a layer stack for emitting light through a top electrode which is at least partly transparent, the organic electroluminescent device comprising:
a conductive foil comprising a substrate having an upper side and a lower side, and a first metal layer located on the upper side of the substrate, wherein a sheet resistance of the first metal layer is less than 0.05 Ω/square, wherein the first metal layer comprises a first metal area and a second metal area, the first metal area being electrically insulated from the second metal area, and wherein the first metal area acts as a bottom electrode;
an organic layer stack deposited on top of the bottom electrode and configured to emit light, wherein the top electrode is located on top of the organic layer stack; and
an at least partly transparent protection element covering at least the top electrode and the organic layer stack;
wherein the conductive foil comprises a second metal layer and a conducting path, the second metal layer having a sheet resistance of less than 0.05 Ω/square and being located on the lower side of the substrate, and
wherein the conducting path is in the substrate and connects the second metal layer to the second metal area of the first metal layer, and wherein the second metal area is directly connected to the top electrode.

2. The organic electroluminescent device according to claim 1, wherein the first metal layer further comprises a conducting diffusion barrier layer at an interface with the organic layer stack.

3. The organic electroluminescent device according to claim 1, wherein the transparent top electrode is made of indium-tin-oxide.

4. The organic electroluminescent device according to claim 1, wherein the top electrode has a thickness below 20 nm and comprises a top metal layer and an electron injection layer at an interface with the organic layer stack.

5. The organic electroluminescent device according to claim 1, wherein the organic layer stack is patterned into sub-areas in order to form light-emitting sub-tiles which are separated from each other by non-emitting areas so as to provide conducting metal tracks to each of the sub-tiles.

6. The organic electroluminescent device according to claim 1, wherein the first metal area and the second metal area of the first metal layer are separated by an insulating filling material.

7. The organic electroluminescent device according to claim 1, wherein the conductive foil is a flexible conductive foil comprising a flexible carrier material.

8. The organic electroluminescent device according to claim 1, wherein the at least partly transparent protection element comprises a transparent, chemically inert layer covering at least the top electrode and the organic layer stack.

9. The organic electroluminescent device according to claim 1, wherein at least the first metal layer comprises copper.

10. A method of forming an organic electroluminescent device having an organic layer stack configured to emit light between a top electrode and a bottom electrode, the method comprising the acts of:
providing a conductive foil by gluing a first metal layer on a first side of a substrate, the first metal layer having a sheet resistance of less than 0.05 Ω/square, wherein the first metal layer comprises a first metal area and a second metal area, the first metal area being electrically insulated from the second metal area, and wherein the first metal area acts as a bottom electrode;

forming the organic layer stack on top of the bottom electrode; and forming an at least partly transparent protection element covering at least the top electrode and the organic layer stack.

11. The method of claim 10, wherein the providing act further comprises the acts of:

gluing a second metal layer on a second side of the substrate, the second side being opposite the first side, wherein the second metal layer has a sheet resistance of less than 0.05 Ω/square; and forming a conducting path in the substrate for connecting the second metal layer to the second metal area of the first metal layer.

12. The method of claim 11, wherein the second metal area is directly connected to the top electrode.

13. The method of claim 10, wherein the conductive foil is flexible.

14. The method of claim 10, wherein the providing act further comprises the act of forming a conducting diffusion barrier layer between the bottom electrode and the organic layer stack.

* * * * *